United States Patent [19]
Harsch et al.

[11] Patent Number: 4,721,903
[45] Date of Patent: Jan. 26, 1988

[54] PROBE AND METHOD FOR ELECTRICALLY CONTACTING SURFACES WITH PROTECTIVE COATINGS

[75] Inventors: Franklin D. Harsch, Renton; Luis J. Lazaro, Jr., Seattle, both of Wash.

[73] Assignee: The Boeing Company, Seattle, Wash.

[21] Appl. No.: 705,991

[22] Filed: Feb. 27, 1985

[51] Int. Cl.$^4$ .................... G01R 31/02; G01R 1/067
[52] U.S. Cl. .................... 324/72.5; 324/158 P;
324/158 F; 324/149; 30/367
[58] Field of Search ............... 30/367; 72/435;
324/158 P, 158 F, 73 PC, 72.5, 149, 515, 525, 65
P, 65 CP; 339/108 TP

[56] References Cited

U.S. PATENT DOCUMENTS

| | | | |
|---|---|---|---|
| 947,391 | 1/1910 | Michael | 30/367 |
| 2,323,925 | 7/1943 | Markwardt | 265/19 |
| 2,384,707 | 9/1945 | Sweet | 30/367 |
| 2,659,862 | 11/1953 | Branson | 324/64 |
| 2,763,935 | 9/1956 | Whaley et al. | 33/169 |
| 2,885,648 | 5/1959 | King | 339/36 |
| 3,229,200 | 1/1966 | Rayburn | 324/62 |
| 3,644,829 | 2/1972 | Chan et al. | 324/158 P |
| 3,944,922 | 3/1976 | Chambers et al. | 324/158 P |
| 3,996,511 | 12/1976 | Baer | 324/72.5 |
| 3,996,516 | 12/1976 | Luther | 324/158 F |
| 4,104,579 | 8/1978 | McIvor | 324/29 |
| 4,335,350 | 6/1982 | Chen | 324/64 |
| 4,394,620 | 7/1983 | Montalto et al. | 324/149 |

FOREIGN PATENT DOCUMENTS

| | | | |
|---|---|---|---|
| 936480 | 12/1955 | Fed. Rep. of Germany . | |
| 2919541 | 12/1979 | Fed. Rep. of Germany . | |
| 0076969 | 6/1977 | Japan | 324/158 P |
| 843870 | 2/1958 | United Kingdom . | |
| 0617753 | 7/1978 | U.S.S.R. | 324/72.5 |

OTHER PUBLICATIONS

IBM Technical Disclosure Bulletin, vol. 14, No. 2, Jul. 1971, p. 558.
IBM Technical Disclosure Bulletin, vol. 18, No. 9, Feb. 1976, pp. 2870-2871.
Proceedings: The Institution of Mechanical Engineers (London) article by B. M. & W. M. Thornton, pp. 349 & 356, Oct.-Dec. 1938.
Portable DLRO Digital Low Resistance Ohmmeters for Micro-Ohm Measurements, Bullein 24-1e, 11/84, Biddle Instruments.
"Electronic Knife for LSI Bus Testing", by Hoffman et al, Electronic Engineering, 4/79, pp. 121, 123.
"A Deluxe Signal Tracer", by Krueger, Radio & Television News, 1/51, pp. 64–66.

Primary Examiner—Reinhard J. Eisenzopf
Assistant Examiner—W. Burns
Attorney, Agent, or Firm—Joan H. Pauly

[57] ABSTRACT

Improvements in electrical test probes. The problem with known probes is that degree of penetration into a material being tested is inconsistent and complete penetration of protective coatings is not reliably achieved. The device and method of the invention provide consistent and reliable penetration and electrical contact. Probe assembly (30) includes a probe tip (44) for penetrating a protective coating (4). An off-center punch (42) transmits an axially outward impact force of a predetermined magnitude to tip (44) when tip (44) is urged against coating (4) to move tip (44) axially inwardly against the force of springs (56, 74). The force compressing spring (56) is suddenly released to allow spring (56) to apply an abrupt impact force to tip (44). The degree of impact and penetration may be adjusted for different coating thicknesses by adjusting the stiffness of spring (56).

7 Claims, 5 Drawing Figures

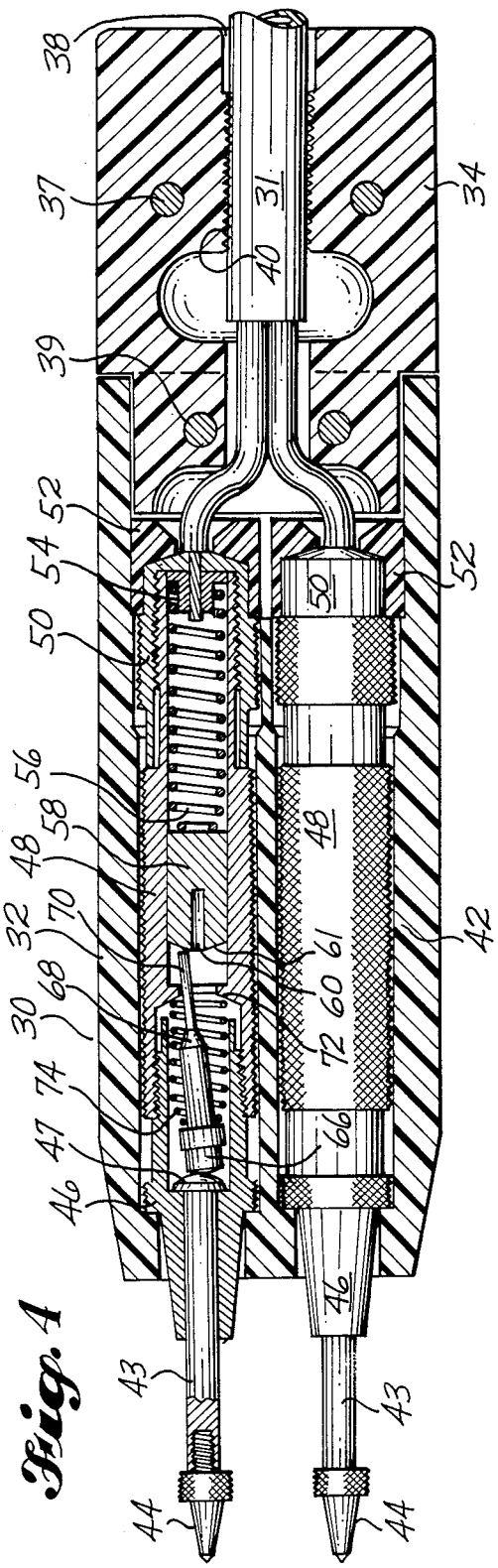

PROBE AND METHOD FOR ELECTRICALLY CONTACTING SURFACES WITH PROTECTIVE COATINGS

TECHNICAL FIELD

This invention relates to resistance test probes and methods for making contact with such probes and, more particularly, to such a probe and method in which contact is made with a conductive body having a protective coating by penetrating the coating to a predetermined depth while minimizing damage to the coating.

BACKGROUND ART

The electrical systems of commercial aircraft are generally grounded to the main structure of the aircraft. In order to accomplish the grounding, a large number of ground wires from the electrical system are connected to ground studs attached to interior surfaces of the main structure at various locations in the aircraft. In a typical large commercial passenger aircraft, there may be as many as 1,000 ground studs each of which has a ground wire attached thereto. During the construction of the aircraft and during certain types of maintenance activity, it is essential to ensure that at least the most critical of these ground connections form good ground paths from the electrical system to the main structure. Without a good ground path, a lightening strike or an electrical fault would not be properly absorbed into the main structure and damage or failure of the electrical system could result.

Methods and apparatus currently in use for testing the ground connections have a number of problems associated with them. Many of the more troublesome of these problems are a result of the fact that the structural member to which the ground stud is attached has a protective coating thereon. This coating usually consists of a primer and paint having a thickness in the order of 1.8 mils. The coating must be completely and consistently penetrated in order to test the resistance between the structural member and the ground stud. However, it is of course desirable to minimize any damage to the coating caused by the testing procedure in order to preserve the corrosion protection function of the coating.

Devices currently in use to make contact with the conductive structural member do not consistently fully penetrate the protective coating and, thus, do not reliably result in accurate readings. When additional force is applied to the device in an effort to ensure complete penetration of the coating, the result is often damage to the device and/or damage to the coating that is sufficiently extensive to require repair of the coating following the testing procedure. The degree of the penetration provided by known devices is user dependent. This dependence on the individual operator results in inconsistent and unreliable readings. In order to avoid the problems of damage to the coating and inconsistent and/or unreliable readings, in some situations the structural member has been spot cleaned before the testing operation in order to ensure a good reliable electrical path. This procedure increases the reliability and accuracy of the testing, but has the serious disadvantage of requiring recoating of the cleaned area following the testing. Such recoating is time consuming and makes the whole testing procedure generally more complicated and more expensive to carry out. The expense of existing systems is further increased by the lack of durability and the relatively short useful life of known devices.

There are a large number of known electrical testing devices having spring biased point contact probes. Such devices are disclosed in U.S. Pat. Nos. 2,659,862, granted Nov. 17, 1953, to N. G. Branson; No. 3,229,200, granted Jan. 11, 1966, to C. C. Rayburn; No. 3,644,829, granted Feb. 22, 1972, to J. Y. Chan et al; No. 3,944,922, granted Mar. 16, 1976, to R. N. C. Chambers et al; No. 3,996,516, granted Dec. 7, 1976, to E. Luther; No. 4,335,350, granted June 15, 1982, to J. T. C. Chen; and No. 4,394,620, granted July 19, 1983, to A. R. Montalto et al. Such devices are also disclosed in British Pat. No. 843,870, published Aug. 10, 1960, and disclosing the invention of S. R. Richardson; IBM Technical Disclosure Bulletin, Volume 14, No. 2, dated July 1971, and entitled "Twin-Lead Contact Probe"; IBM Technical Disclosure Bulletin, Volume 18, No. 9, dated Feb. 1976, and entitled "Plunger Contact Assembly"; and "The Measurement of the Thickness of Metal Walls From One Surface Only, By An Electrical Method", an article by B. M. Thornton and W. M. Thornton on pages 349 and 356 of "Proceedings: The Institution of Mechanical Engineers (London)", Volume 140, Oct.-Dec. 1938.

U.S. Pat. Nos. 2,763,935, granted Sept. 25, 1956, to R. M. Whaley et al; No. 2,885,648, granted May 5, 1959, to H. H. King; and No. 4,104,579, granted Aug. 1, 1978, to M. C. McIvor each disclose electrical testing apparatus having point probes that are apparently fixed. Such apparatus is also shown in West German Pat. No. 936,480, dated 1955, and disclosing an invention by Karl Zangl. West German Pat. No. 2,919,541, dated 1979, discloses an invention by Viktor Vanicek consisting of an electrical test instrument having point probes that are mounted on a slidable head so that they may be driven into wood by an impact device to test the moisture content of the wood.

In the testing procedure disclosed by Luther, a lacquered printed circuit is contacted by probes and then the circuit is subjected to ultrasonic vibrations to remove excess coating, impurities, and oxides along the points of contact to ensure good contact. Montalto et al disclose a test device in which the test probes are introduced into apertures to contact test lands within the apertures. The probes are biased outwardly by springs that are described as exerting force sufficient to penetrate any nonconductive coatings on the test lands. The device described in the article by the Thorntons includes "spring-controlled rotating points".

U.S. Pat. No. 2,323,925, granted July 13, 1943, to L. J. Markwardt discloses a testing tool for testing the hardness of nonmetallic materials. The tool includes two pointed pins that penetrate the material being tested. In one embodiment of the tool, an off-center punch mechanism is included to provide an impact force of a constant magnitude to drive the pins into the material. The displacement or amount of penetration of the pins is then measured to determine the degree of hardness. Another embodiment of the tool permits hardness to be measured as a function of the amount of force required for achieving a predetermined amount of penetration.

The above patents and the prior art that is discussed and/or cited therein should be studied for the purpose of putting the present invention into proper perspective relative to the prior art.

DISCLOSURE OF THE INVENTION

A subject of the invention is, in an electrical testing system, a device for making electrical contact with a conductive body having a protective coating of a predetermined thickness. According to an aspect of the invention, the device comprises probe means for making point contact with the conductive body. This probe means is mounted for sliding axial movement and has a pointed tip portion shaped and dimensioned to provide good electrical contact while minimizing damage to the coating. Resilient means resiliently biases the tip portion axially outwardly. Punch means is provided for automatically applying an axially outward force of a predetermined magnitude to the tip portion of the probe means when the tip portion is urged against the coating to slide the probe means axially inwardly against the force of the resilient means. The magnitude of the outward force is just sufficient is cause the tip portion to penetrate the coating and make good electrical contact with the conductive body.

According to another aspect of the invention, the device further comprises a housing in which the probe means is mounted and from which the tip portion extends. An electric cable extends into the housing and has one end electrically connected to the probe means. A strain relief clamp is attached to the housing. This clamp has a passageway through which a portion of the cable extends. The passageway includes means for gripping the portion of the cable extending therethrough and preventing it from moving relative to the passageway. This feature of the invention has the advantage of making the device more durable and resistant to mishandling. For example, if the device is handled by grabbing the cable, the clamping of the cable in the passageway serves to prevent disturbance of the electrical connection between the cable and the probe means.

A feature of the invention is punch means that comprises a spring which is compressed to provide the energy for applying the outward force to the tip portion of the probe means. The punch means includes means for compressing the spring a predetermined distance by moving the probe means axially inwardly and then abruptly allowing the spring to expand to apply such outward force to the tip portion. This feature of the invention reliably applies a consistent amount of force against the tip portion to cause the tip portion to penetrate the coating. The abrupt application of the force helps ensure that the penetration of the coating is straight and clean and only minimally disturbs the integrity of the coating. With the coating relatively undisturbed, the corrosion protection of the structural member or other conductive body is preserved without there being any need for recoating the body. This feature of the invention also has the advantage of making it possible to use standard components in the construction of the device to thereby reduce the difficulty and expense of manufacturing the device.

Another subject of the invention is a method of making good electrical contact with a conductive body having a protective coating of a predetermined thickness while minimizing damage to the coating. According to an aspect of the invention, the method comprises providing probe means mounted for sliding axial movement and having an axially outer pointed tip portion, and providing resilient means for biasing the probe means axially outwardly. The tip portion of the probe means is pressed against the coating to slide the probe means axially inwardly against the force of the resilient means. While continuing to press the tip portion against the coating, the operator allows the inward movement of the probe means to automatically cause an axially outward force of a predetermined magnitude to be abruptly applied to the probe means. This in turn causes the tip portion to penetrate the coating and make good electrical contact with the conductive body. Preferably, the step of allowing such inward movement to cause an outward force to be applied comprises compressing a spring and then abruptly allowing the spring to expand to apply such outward force.

Still another subject of the invention is a method of determining whether there is a good grounding connection between a portion of an aircraft main structure having a protective coating of a predetermined thickness and a ground stud mounted on such portion. According to an aspect of the invention, the method comprises providing first probe means mounted for sliding axial movement and having an axially outer pointed tip portion, and providing resilient means for biasing the probe means axially outwardly. The probe means is electrically connected to a device for measuring resistance. The tip portion of the probe means is pressed against said portion of the aircraft structure to slide the probe means axially inwardly against the force of the resilient means. While continuing to press the tip portion against the aircraft structure, the operator allows the inward movement of the probe means to automatically cause an axially outward force of a predetermined magnitude to be applied to the probe means. This in turn causes the tip portion of the probe means to penetrate the coating and make good electrical contact with the aircraft structure. Second probe means is electrically connected to the device for measuring resistance. While simultaneously holding the tip portion of the first probe means in electrical contact with the aircraft structure and holding the second probe means in electrical contact with the ground stud, the operator measures the resistance between the first and second probe means.

The method and apparatus of the invention solve the problems discussed above of inconsistent penetration of the protective coating, inconsistent readings, and damage to the coating requiring an additional step of recoating. The method and apparatus of the invention provide the application of a force of a predetermined magnitude to cause the probe means to penetrate the coating. The constant predetermined magnitude of the force ensures that the degree of penetration is consistent and independent of the human operator. The predetermined magnitude is chosen so that the penetration will be sufficient to cause the tip portion to go all the way through the coating and make good contact with the conductive body, and at the same time the hole formed will be of a minimum size to maintain the protection provided by the coating. The coating is in theory of a constant thickness, but there inevitably will be variations in the exact thickness from one point to another. Such variations can easily be accommodated by providing an outward force of a magnitude that will cause the probe tip portion to penetrate a distance very slightly greater than the maximum thickness. This ensures that good electrical contact is consistently and reliably achieved.

The apparatus of the invention also has the advantage of being durable and relatively inexpensive and easy to operate. The method of the invention is easy to carry out and does not require any heavy, complicated, or unreasonably expensive equipment.

These and other advantages and features will become apparent from the detailed description of the best mode for carrying out the invention that follows.

BRIEF DESCRIPTION OF THE DRAWINGS

In the drawings, like element designations refer to like parts throughout, and:

FIG. 2 is a sectional view of an aircraft structural member, showing the probe tips of the device of the invention penetrating the protective coating.

FIG. 3 is a greatly simplified circuit diagram of the aircraft electrical system and the testing apparatus shown in FIG. 1.

FIG. 4 is a sectional view of the preferred embodiment of the device of the invention shown in FIG. 1.

BEST MODE FOR CARRYING OUT THE INVENTION

Figure 1:
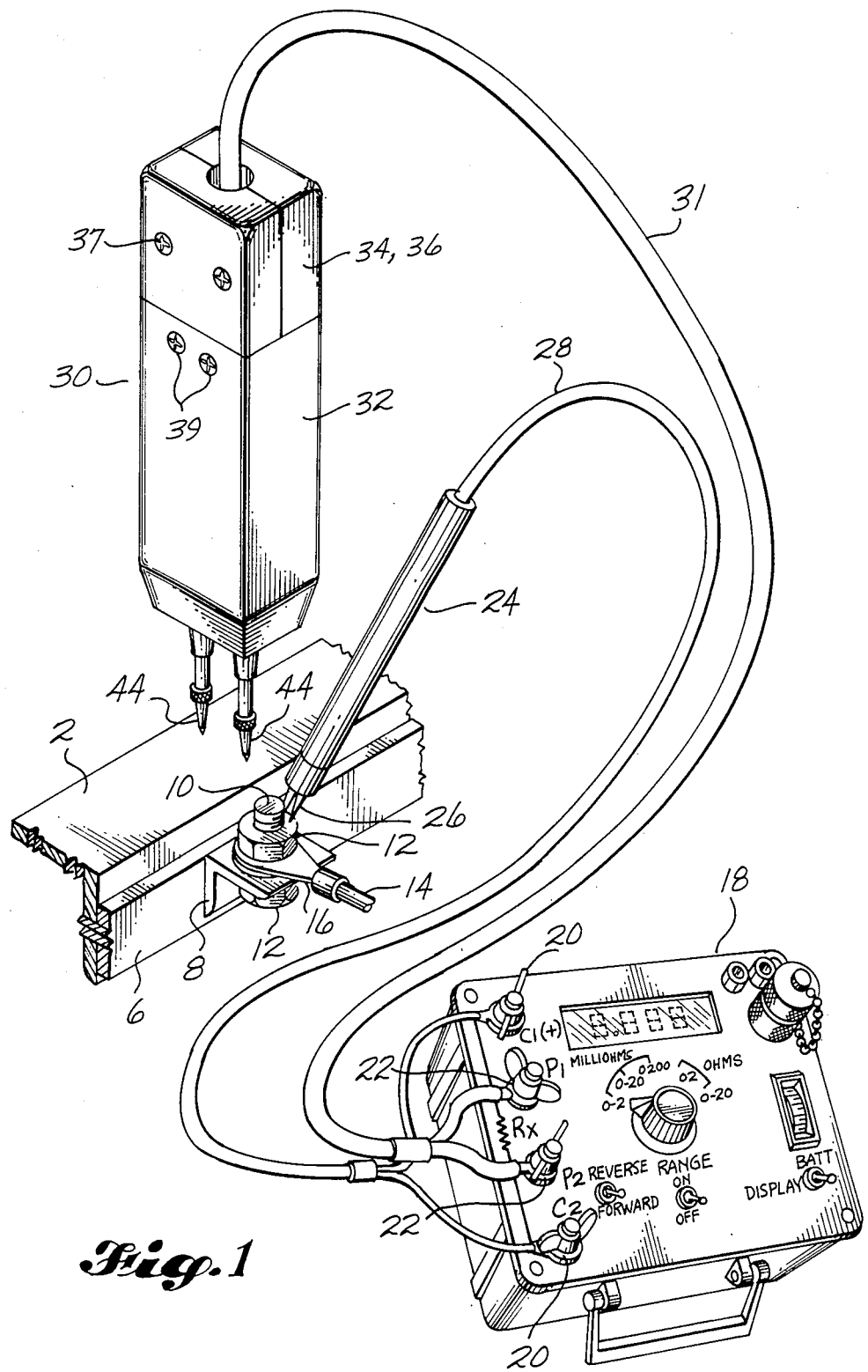
FIG. 1 is a pictorial view of the preferred embodiment of the device of the invention shown in combination with a testing meter and another probe in a typical use situation.

The drawings show a test probe assembly 30 that is constructed according to the invention and that also constitutes the best mode of the apparatus of the invention currently known to the applicant. The drawings also illustrate the best mode of carrying out the method of the invention currently known to the applicant. FIGS. 1-3 illustrate the anticipated primary use for the method and apparatus of the invention. These figures show the test probe assembly 30 being used to test the grounding connection between a ground stud 10 and a main aircraft structural member 2. Although the illustrated use is expected to be the primary use, it is of course of be understood that the method and apparatus of the invention may also be used to great advantage in a variety of other situations in which it is necessary to obtain electrical contact with a conductive body having a protective coating without unduly disturbing such coating.

FIG. 3 shows a greatly simplified circuit diagram of the aircraft electrical system. As illustrated in FIG. 3, the ground wires from the various user components of the system terminate at ground studs attached to the main structure of the aircraft. The present invention is directed toward testing the bonding and the electrical connection between such ground studs and the aircraft structure to which they are attached. Referring to FIGS. 1 and 3, the aircraft structural member 2 shows may be, for example, a structural beam and may be located at any of a large number of locations in the aircraft. The ground stud 10 is mounted onto the member 2 by means of a bracket 8. As shown in FIGS. 1 and 3, a structural interface 6 is frequently interposed between the member 2 and the bracket 8. This interface 6 may be provided to facilitate the mounting of the bracket 8 or for reinforeceing the member 2. The ground stud 10 extends through the bracket 8 and is held in position relative thereto by means of nuts 12. A ground wire 14 from a user component of the aircraft electrical system has a metal end 16 which engages the ground stud 10 and is held in position by one of the nuts 12.

The ground path between the stud 10 and the structural member 2 may be tested using a number of different types of probes and test meters. However, since the amount of resistance being measured is of a very small magnitude, in the order of 0.0001 ohms, it is desirable to use the type of meter 18 shown in FIG. 1. This meter 18 uses Kelvin connections to measure very small resistances and is of the type manufactured by Biddle Instruments of Blue Bell, Pennsylvania and sold under the trademark DLRO and the catalog number 247000. This type of meter has two positive terminals and two negative terminals and requires a two point contact at each end of the electrical path being tested. Therefore, the preferred embodiment of the device 30 of the invention has a two point probe and is used in combination with a two point pencil probe 24, as shown in FIG. 1.

The pencil probe 24 is connected to the meter 18 by means of a dual conductor cable 28. This cable 28 provides electrical connection between each of the probe tips 26 of the probe 24 and a different one of the negative terminals 20 of the meter 18. Each of the probe tips 44 of the test probe assembly 30 of the invention is connected by a two conductor cable 31 to a different one of the two positive terminals 22 of the meter 18. In carrying out the tests, the tips 26 of the pencil probe 24 are brought into contact with the ground stud 10 or one of the nuts 12 and the tips 44 of the test probe assembly 30 make contact with the structural member 2. FIG. 2 illustrates the tips 44 penetrating the protective coating 4 on the member 2.

Figure 5:
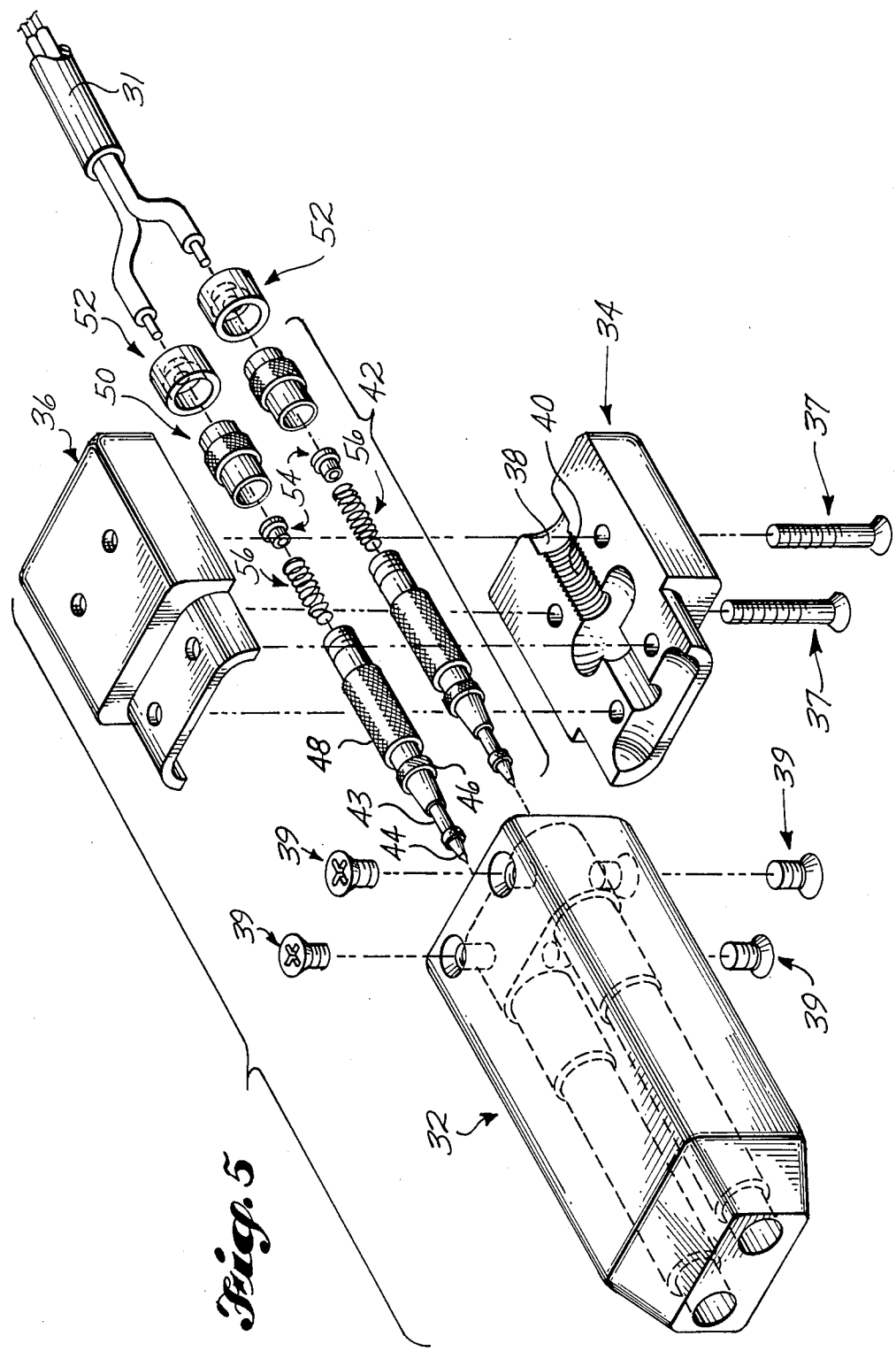
FIG. 5 is a partially exploded pictorial view of the device shown in FIG. 4.

The preferred embodiment of the test probe assembly of the invention can most clearly be seen in FIGS. 4 and 5. The assembly 30 includes a housing 32 made from a nonconductive material and dimensioned and shaped to be easily held in one hand. The probe tips 44 extend axially outwardly from one end of the housing 32, and the cable 31 extends outwardly from the other end of the housing 32. A two-piece strain relief clamp 34, 36 is provided at such other end for gripping the cable 31 to thereby prevent any strain on the electrical connection between the cable 21 and the probe tips 44 should the assembly 30 be mishandled such as by being picked up by grasping the cable 31. The two parts 34, 36 of the clamp cooperate to form a threaded passageway 38. The cable 31 is electrically connected to the probe means of the assembly 30 and then extends out of the housing 32 through the passageway 38 in the clamp 34, 36. The diameter of the passageway 38 is sized to be slightly less than the diameter of the cable 31 so that the threads 40 of the passageway 38 will grip the cable 31 when the two halves 34, 36 of the clamp are secured together. This prevents the cable 31 from moving within the passageway 38 and thus prevents it from moving relative to the housing 32 and the elements of the assembly 30 within the housing 32. The two parts of the clamp 34, 36 may be secured together and to the housing 32 by any suitable means, such as the screws 37, 39 shown in FIGS. 1, 4, and 5.

The probe assembly of the invention includes probe means for making point contact with a conductive body. This probe means is mounted for sliding axial movement relative to the housing 32 of the assembly. In the preferred embodiment, the probe means includes the two probe tips 44 described above, and resilient means resiliently biases the tips 44 axially outwardly with respect to the housing 32. The tips 44 are shaped and dimensioned to provide good electrical contact while minimizing the size of the holes made by the tips 44 in the protective coating on the conductive body to minimize damage to the coating.

The probe assembly of the invention also includes punch means for automatically applying an axially outward force of a predetermined magnitude to the tips 44 when the tips 44 are urged against the coating 4 on the conductive body 2 to slide the probe means 43, 44 axially inwardly against the force of the resilient means. The magnitude of the force applied is just sufficient to cause the tips 44 to penetrate the coating 4 and make good electrical contact with the body 2. FIG. 2 illustrates the penetration of the coating 4. In the preferred embodiment of the invention, the punch means is provided in the form of an off-center punch of a known type. The center punch 42 shown in FIGS. 4 and 5 is the preferred type of punch means. The punch 42 is of the type manufactured by the L. S. Starret Co. of Athol, Massachusetts and having the model number 18-AA. It is of course to be understood that other off-center punches and other types of devices having about the same dimensions and providing the same type of force would also be suitable for use in the probe assembly of the invention.

Referring to FIGS. 4 and 5, each of the center punches 42 is mounted within the nonconductive housing 32 of the assembly 30 and has a probe portion extending axially therefrom. The probe portions of the center punches 42 form the probe means of the test probe assembly 30. The probe portion of each punch 42 includes a pointed tip 44 attached to the end of a shaft 43. The tips 44 could also be formed integrally with the shafts 43, but the two part construction permits easy and inexpensive replacement of the tips 44 when they become worn. Each shaft 43 extends into a lower tip portion 46 of the metal housing 46, 48, 50 of the respective punch 42. The shaft 43 has a head 47 at its axially inner end that engages a shoulder formed by housing portion 46 to prevent the shaft 43 from slipping out of the housing 46, 48, 50.

The metal punch housing includes the tip portion 46, a center portion 48, and an end cap portion 50 opposite the tip portion 46. Within the nonconductive housing 32 of the assembly 30, an insulating cap 52 is provided around the axially inner end of each metal end cap housing portion 50 of the punches 42. Inside the strain relief clamp 34, 36, the two conductors of the cable 31 separate, and each conductor extends through one of the insulating caps 52 and the corresponding metal end cap 50 and into the corresponding punch 42. The end of the conductor extending through the end cap 50 and into the punch 42 is stripped of insulation and is received into a center axial hole in a generally T-shaped washer 54. The conductor is soldered to the washer 54 to provide an electrical connection between the conductor and the punch 42. The electrical connection also includes the soldering of a spring 56, described in greater detail below, to the washer 54.

The punch 42 has an axial passageway extending therethrough. One end of the passageway has the shaft 43 extending outwardly therefrom, as described above, and is sized to guide the axial movement of the shaft 43. A conductor from the cable 31 enters the other end of the passageway. Axially inwardly of the shaft 43 is a rocking member 66. One end of member 66 contacts the head 47 of the shaft 43. The surfaces of these two members 47, 66 which contact each other each have a rounded configuration, as shown in FIG. 4, to permit rocking member 66 to pivot with respect to shaft head 47. A mid portion 68 of member 66 is tapered radially inwardly toward the end cap portion of the punch 42 and terminates in an elongated cylindrical pin end 70 of relatively small diameter. This pin end 70 extends through a reduced diameter portion of the passageway through the punch 42 formed by a radially inwardly extending flange 72. As seen in FIG. 4, in the rest position of the punch 42 the member 66 is oriented at an angle to the axis of the punch 42 and the side of pin end 70 rests against the radial inner wall of the flange 72. A spring 74 is provided to bias the rocking member 66 axially outwardly and to retain member 66 within the portion of the punch passageway axially outward of the flange 72.

The punch 42 also includes a hammer member 58 positioned in the axial passageway axially inwardly of the rocking member 66. The axially outer radial edge 61 of the hammer member 58 is beveled, as shown in FIG. 4. A center axial slot 60 opens onto the beveled surface 61 and extends axially inwardly into the hammer member 58 to approximately the axial center of member 58. As shown in FIG. 4, the axial inner tp of pin end 70 of rocking member 66 rests against the beveled edge 61 of hammer member 58 when the punch 42 is in its rest position. The beveling of the edge 61 biases the portion of the pin end 70 contacting the hammer member 58 away from the radial center of the passageway and toward its sidewall. The spring 56 mentioned above is postioned between the hammer member 58 and the T washer 54 and end cap 50 to bias the hammer member 58 axially outwardly.

The punch 42 works in a known manner. When the tip 44 is pressed against a surface of an object to be tested, the shaft 43 moves axially inwardly. The contact with the head 47 of the shaft 43 causes the rocking member 66 to be moved axially inwardly against the force of the spring 74. The pin end 70 of rocking member 66 is in turn moved against the beveled edge 61 of the hammer member 58. The beveling of edge 61 maintains the member 66 in the angled position shown in FIG. 4. The inward movement of rocking member 66 forces hammer member 58 axially inwardly to compress the spring 56. When the tapered portion 68 of rocking member 66 comes into contact with the flange 72, the tapered surface 68 acts as a cam and the rocking member 66 is straightened into an axially aligned position. When rocking member 66 aligns with the axis of the punch 42, pin ends 70 slips into slot 60 in hammer member 58, thus abruptly releasing the compressive force on the spring 56. Spring 56 then expands, pin end 70 bottoms on the inner radial surface of slot 60, and this bottoming causes hammer member 58 to exert an abrupt axially outward force on tip 44 via rocking member 66 and shaft 43. The degree of force exerted by spring 56 on rocking member 66 via hammer member 58 is determined by the stiffness of the spring 56 and the distance that it is compressed. In calibrating the assembly to provide a desired degree of penetration for a particular application, one way of providing the desired degree of stiffness, and thus the desired degree of force, is to simply adjust the length of the spring 56 to thereby adjust its stiffness.

In order to determine whether there is a good grounding connection between an aircraft structural member 2 having a protective coating 4 of a predetermined thickness and a ground stud 10 mounted on such structure 2, the method of the invention is carried out as follows. With one hand, the operator presses the tips 44 of the probe assembly 30 against the coated structural member 2 to slide the probe shaft 43 axially inwardly against the force of the springs 56, 74. The pressing of the tips 44 against the member 2 causes the punches 42 to operate as described above to automatically cause an axially outwardly force of a predetermined magnitude to be abruptly applied to the probe tips 44. As described above, this outward force is supplied by the abrupt expansion of the spring 56. The application of the outward force in turn causes the tips 44 to penetrate the coating 4 and make good electrical contact with the aircraft structural member 2, as shown in FIG. 2. With contact established between the probe assembly 30 and the structural member 2, the probe tips 26 of the pencil probe 24 are touched to the ground stud 10 or one of the nuts 12. As described above and as shown in FIG. 1, both probe assembly 30 and pencil probe 24 are attached to ohmmeter 18. The operator holds the probe assembly 30 in position making electrical contact with structural member 2 with one hand and with the other hand holds pencil probe 24 in position making electrical contact with ground stud 10 and, while maintaining these electrical connections, measures the resistance between the portion of the structural member 2 contacted by the probe assembly 30 and the ground stud 10 by reading the meter 18. This completes the test.

It will be obvious to those skilled in the art to which this invention is addressed that the invention may be used to advantage in a variety of situations. Therefore, it is also to be understood by those skilled in the art that various changes, modifications, and omissions in form and detail may be made without departing from the spirit and scope of the invention as defined by the following claims.

What is claimed is:

1. In an electrical testing system, a device for making electrical contact with a conductive body having a protective coating of a predetermined thickness, comprising:
    probe means for making point contact with said body, said means being mounted for sliding axial movement and having a pointed tip portion shaped and dimensioned to provide good electrical contact while minimizing damage to the coating;
    resilient means for exerting a biasing force to resiliently bias said tip portion axially outwardly; and
    punch means for automatically applying an abrupt axially outward force of a predetermined magnitude to said tip portion when said tip portion is urged against said coating to slide the probe means axially inwardly against said biasing force of the resilient means, said magnitude being just sufficient to cause said tip portion to penetrate the coating and make good electrical contact with said body.

2. A device as described in claim 1, further comprising a housing in which the probe means is mounted and from which said tip portion extends; an electric cable extending into the housing and having one end electrically connected to the probe means; and a strain relief clamp attached to the housing and having a passageway through which a portion of the cable extends, said passageway including means for gripping said portion of the cable and preventing it from moving relative to the passageway.

3. A device as described in claim 1, in which the punch means comprises a spring, and means for compressing said spring a predetermined distance by moving the probe means axially inwardly and then abruptly allowing said spring to expand to apply said outward force to said tip portion.

4. A method of making good electrical contact with a conductive body having a protective coating of a predetermined thickness while minimizing damage to the coating, comprising:
    providing probe means mounted for sliding axial movement and having an axially outer pointed tip portion, and providing resilient means for exerting an axially outward biasing force on the probe means;
    pressing said tip portion against the coating to slide the probe means axially inwardly against said biasing force of the resilient means;
    while continuing to press said tip portion against the coating, allowing the inward movement of the probe means to automatically cause an axially outward force of a predetermined magnitude to be abruptly applied to the probe means to in turn cause said tip portion to penetrate the coating and make good electrical contact with said body while minimizing damage to the coating.

5. A method as described in claim 4, in which the step of allowing said inward movement to cause said outward force to be applied comprises compressing a spring and then abruptly allowing said spring to expand to apply said outward force.

6. A method of determining whether there is a good grounding connection between a portion of an aircraft main structure having a protective coating of a predetermined thickness and a ground stud mounted on said portion, comprising:
    providing first probe means mounted for sliding axial movement and having an axially outer pointed tip portion, and providing resilient means for exerting an axially outward biasing force on the probe means;
    electrically connecting said probe means to a device for measuring resistance;
    pressing said tip portion against said portion of the aircraft structure to slide the probe means axially inwardly against said biasing force of the resilient means;
    while continuing to press said tip portion against said portion of the aircraft structure, allowing the inward movement of the probe means to automatically cause an axially outward force of a predetermined magnitude to be applied to the probe means to in turn cause said tip portion to penetrate the coating and make good electrical contact with the aircraft structure while minimizing damage to the coating;
    electrically connecting second probe means to said device for measuring resistance; and
    while simultaneously holding said tip portion in electrical contact with the aircraft structure and holding the second probe means in electrical contact with the ground stud, measuring the resistance between the first and second probe means.

7. A method as described in claim 6 in which the step of allowing said inward movement to cause said outward force to be applied comprises compressing a spring and then abruptly allowing said spring to expand to apply said outward force.

* * * * *